(12) United States Patent
Yasuda

(10) Patent No.: US 8,717,836 B2
(45) Date of Patent: *May 6, 2014

(54) SEMICONDUCTOR MEMORY DEVICE

(71) Applicant: International Business Machines Corporation, Armonk, NY (US)

(72) Inventor: Takeo Yasuda, Kyoto (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/653,701

(22) Filed: Oct. 17, 2012

(65) Prior Publication Data

US 2013/0039137 A1 Feb. 14, 2013

Related U.S. Application Data

(63) Continuation of application No. 12/759,762, filed on Apr. 14, 2010, now Pat. No. 8,295,105.

(30) Foreign Application Priority Data

Apr. 15, 2009 (JP) .................................. 2009-98747

(51) Int. Cl.
  *G11C 7/00* (2006.01)
(52) U.S. Cl.
  USPC ........................................................ 365/194
(58) Field of Classification Search
  USPC ........................................................ 365/194
  See application file for complete search history.

(56) References Cited

U.S. PATENT DOCUMENTS

| 6,512,709 | B1 * | 1/2003 | Nakahara et al. | 365/200 |
| 6,717,877 | B2 * | 4/2004 | Suzuki et al. | 365/210.12 |
| 7,035,149 | B2 * | 4/2006 | Shimizu | 365/191 |
| 8,295,105 | B2 * | 10/2012 | Yasuda | 365/194 |
| 2010/0265778 | A1 * | 10/2010 | Yasuda | 365/194 |

FOREIGN PATENT DOCUMENTS

| JP | 7262076 A | 10/1995 |
| JP | 09073782 | 3/1997 |
| JP | 10233090 | 9/1998 |
| JP | 10289585 A | 10/1998 |
| JP | 11039875 A | 2/1999 |

(Continued)

OTHER PUBLICATIONS

Application No.: JP2009098747 Filed Apr. 15, 2009 Applicant: Takeo Yasuda Information Materials for IDS cited on JPO Office Action dated Apr. 17, 2012.

(Continued)

*Primary Examiner* — Hoai V Ho
*Assistant Examiner* — Pablo Huerta
(74) *Attorney, Agent, or Firm* — Parashos Kalaitzis

(57) ABSTRACT

A Static Random Access Memory (SRAM) includes word lines WL, bit lines BL, address decoders that select one of the word lines WL in response to an address signal AD, a sense amplifier that is activated in response to a sense amplifier enable signal SAE, and a sense amplifier control circuit that generates the sense amplifier enable signal SAE. In this device, the more distant the word line WL is from the sense amplifier, the longer the sense amplifier control circuit sets the delay time of the sense amplifier enable signal SAE so that the more distant the word line WL is from the sense amplifier, the later the sense amplifier is activated.

3 Claims, 18 Drawing Sheets

(56) References Cited

FOREIGN PATENT DOCUMENTS

| | | |
|---|---|---|
| JP | 11203873 A | 7/1999 |
| JP | 11317098 A | 11/1999 |
| JP | 11328972 A | 11/1999 |
| JP | 2000251472 | 9/2000 |
| JP | 2001357675 A | 12/2001 |
| JP | 2002074970 A | 3/2002 |
| JP | 200208282 A | 7/2002 |
| JP | 2008159171 A | 7/2008 |

OTHER PUBLICATIONS

Date of JPO Office Action: Apr. 19, 2011 Information Materials for IDS.

* cited by examiner

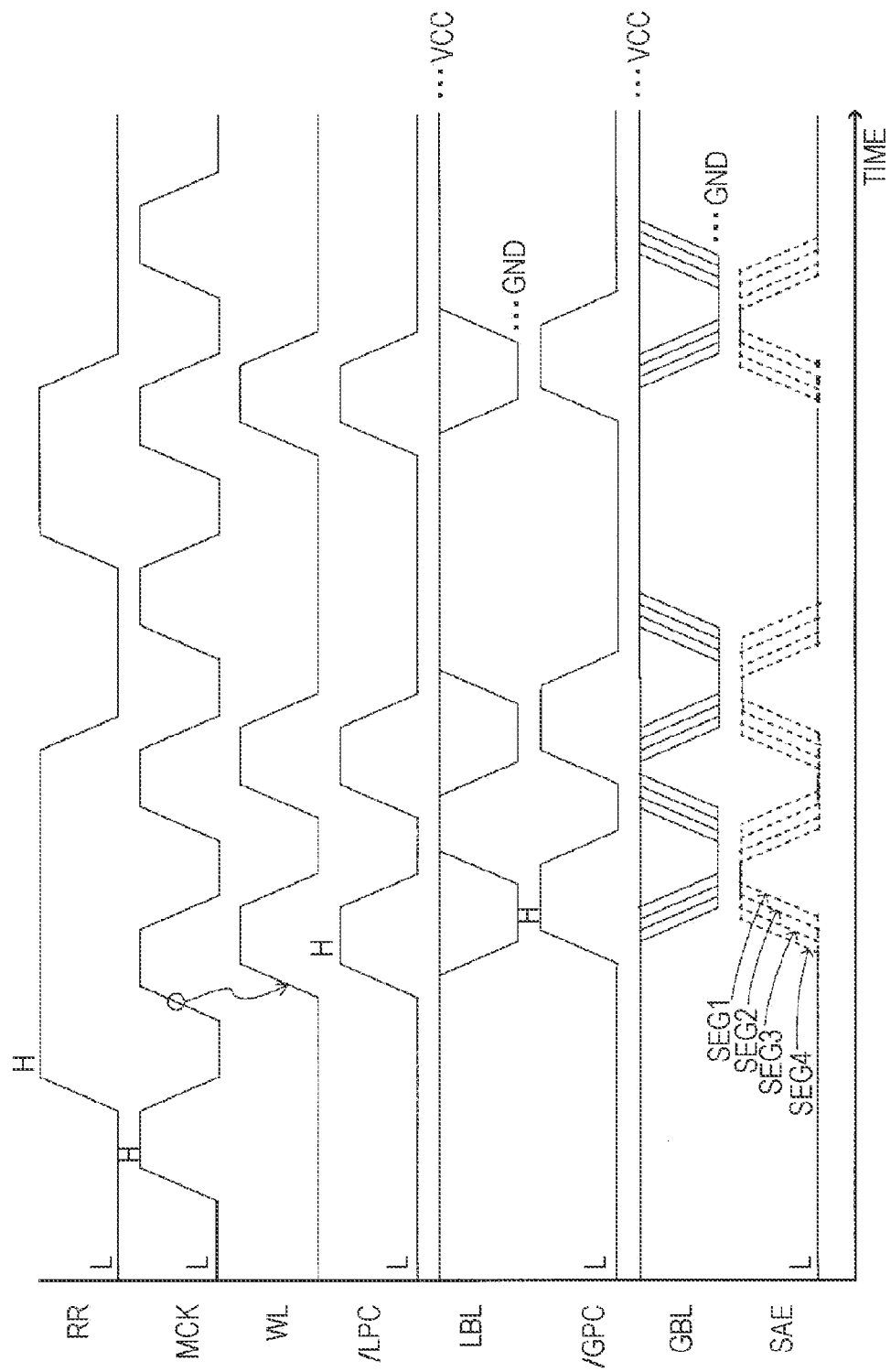

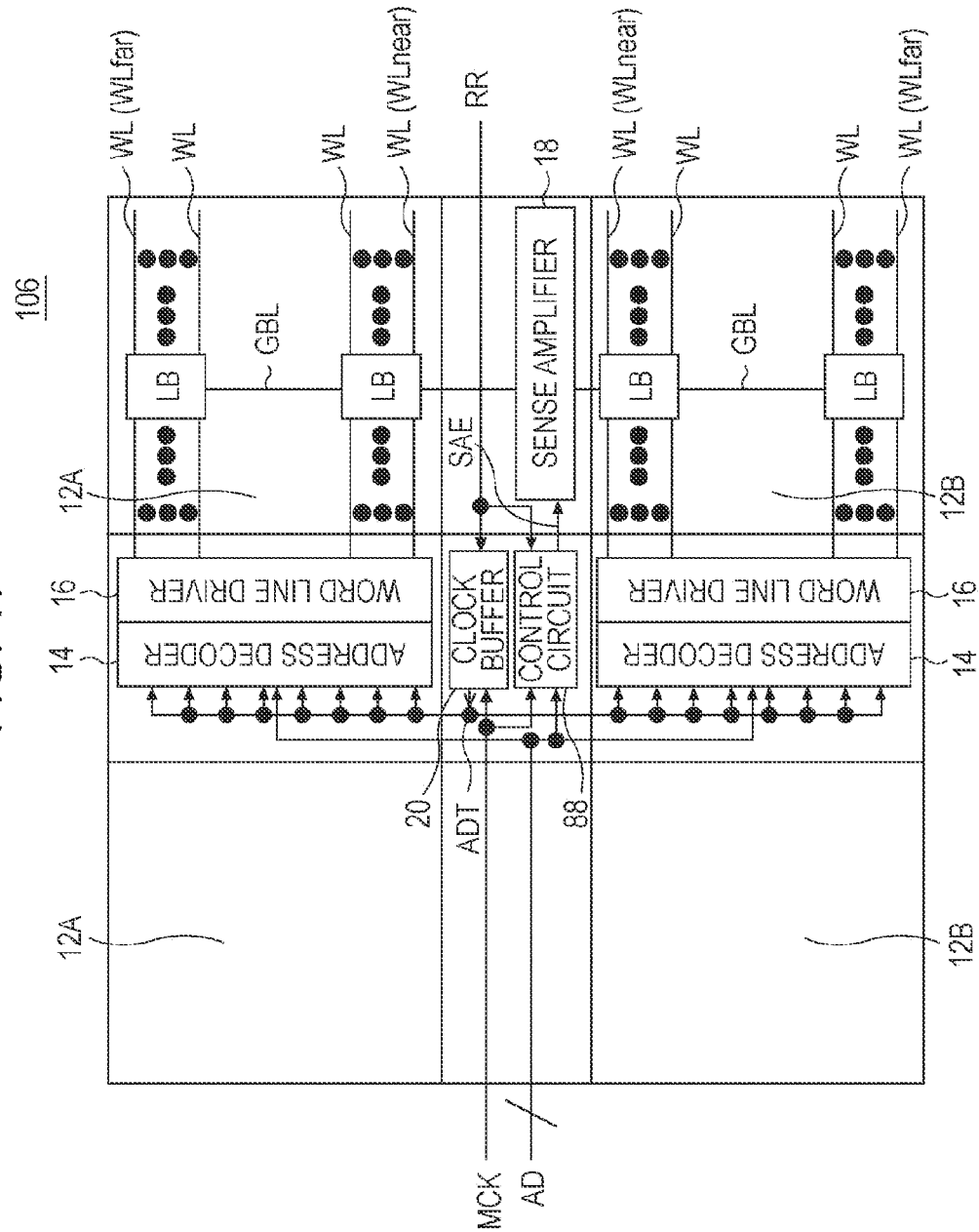

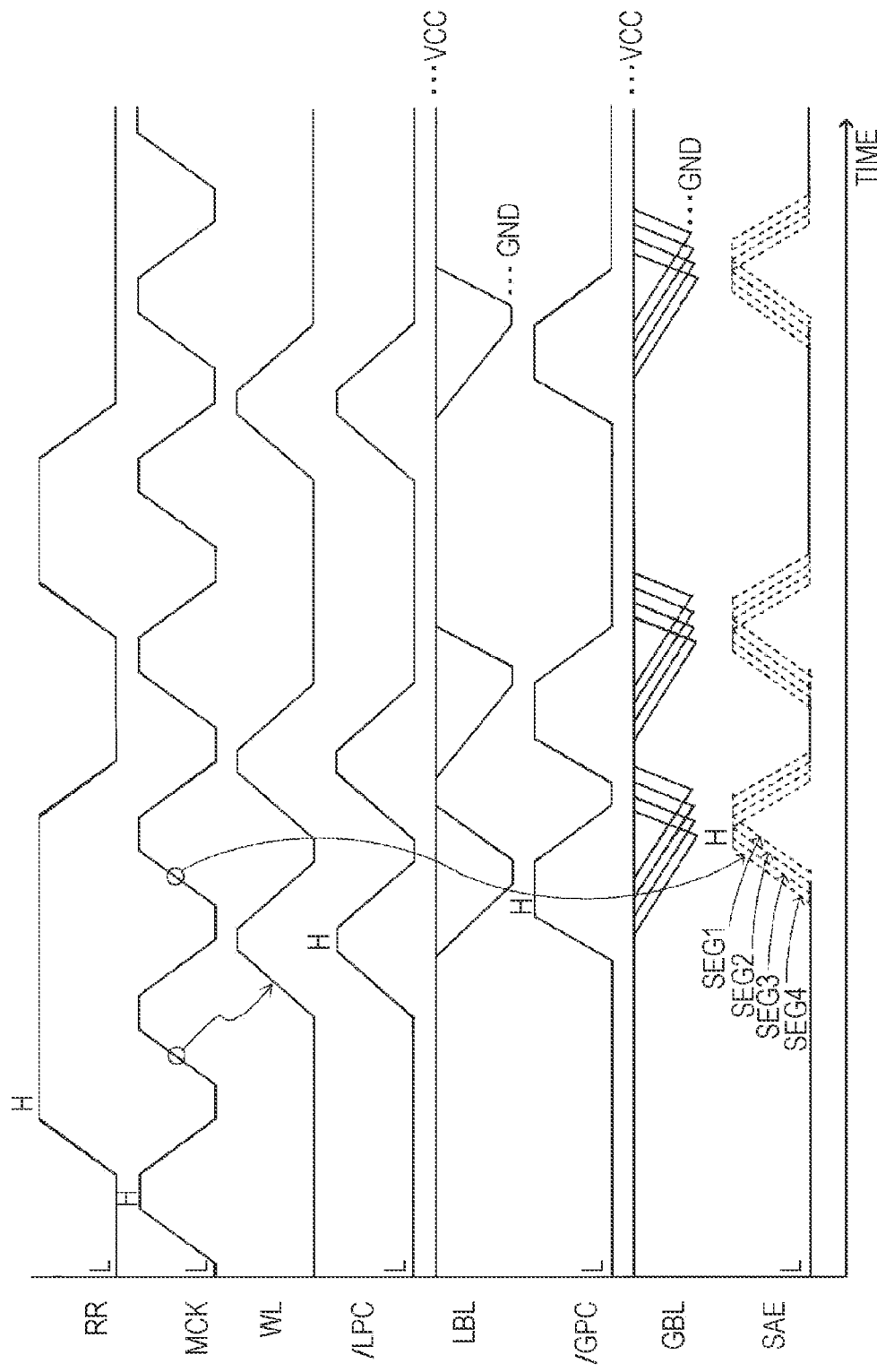

SEMICONDUCTOR MEMORY DEVICE

CROSS-REFERENCE TO RELATED APPLICATION

This application, under 35 U.S.C. §120, is a Continuation of and claims priority from U.S. patent application Ser. No. 12/759,762 filed Apr. 14, 2010, which in turn claims priority under 35 U.S.C. §119 from Japanese patent application S/N 2009-98747 filed Apr. 15, 2009, the entire contents of both applications are incorporated herein by reference.

FIELD OF THE INVENTION

The present invention relates to semiconductor memory devices, and in particular, relates to a semiconductor memory device optimizing the timing of activation of a sense amplifier.

BACKGROUND OF THE INVENTION

Semiconductor memory devices include, for example, Dynamic Random Access Memories (DRAMs), Static Random Access Memories (SRAMs), and Read Only Memories (ROMs). In general, a semiconductor memory device includes word lines, bit lines, and a sense amplifier. When a word line is selected and driven, a potential is generated on a corresponding bit line. A sense amplifier amplifies the potential. The time between when a word line is driven and when a potential is generated on a corresponding bit line and the time between when the potential is generated and when the sense amplifier amplifies the potential are very short and thus are substantially negligible. However, when the clock frequency of a semiconductor memory device is high, these times cannot be ignored. Especially, the difference between the following cases in the time between when a potential is generated and when a sense amplifier amplifies the potential is too large to ignore: a case where a word line far from the sense amplifier is driven and a case where a word line near the sense amplifier is driven. During the time between when a word line is driven and when a sense amplifier amplifies a potential, data is unstable. Thus, a soft error is prone to occur. A soft error is a phenomenon in which the logic of data is inverted due to radiation (for example, alpha radiation) incident from the outside.

Japanese Patent Application Publication No. 9-73782 discloses a semiconductor memory device including a plurality of timing adjustment circuits. Each of the timing adjustment circuits is provided for each cell array block. The timing adjustment circuit adjusts the respective operational timings of a sense amplifier, an input-side reset circuit, an output-side reset circuit, and an output circuit in the cell array block on the basis of clocks from a clock buffer. In the semiconductor memory device, the operational timings need not be readjusted every time the number of cell array blocks is increased. Moreover, in the semiconductor memory device, no margin needs to be prepared for the operational timings. Thus, the access speed is improved. However, in the semiconductor memory device disclosed in Patent Document 1, the timing of activation of a sense amplifier is not optimized in a manner that depends on a word line to be selected.

Japanese Patent Application Publication No. 2000-251472 discloses an integrated circuit having a programmable delay control function. The integrated circuit includes a plurality of arrays. Each of the arrays is partitioned into a plurality of blocks. Each of the blocks includes a block control circuit. Each block control circuit includes a sense amplifier, a sense amplifier control signal generation circuit, a delay adjustment circuit, and a secondary amplifier control signal generation circuit. The sense amplifier is coupled to local data lines, and the local data lines are coupled to a column decoder. The column decoder is coupled to memory cells via bit lines. The sense amplifier provides an output on global data lines. The integrated circuit further includes secondary amplifiers, delay adjustment circuits, and first and second fuse circuits. The block control circuit is coupled to the global data lines and provides an output to the corresponding secondary amplifier via the global data lines. Each of the delay adjustment circuits provides the timing of enabling the corresponding secondary amplifier. The amount of delay is determined on the basis of information provided from the second fuse circuit. The block control circuit provides a secondary amplifier control signal to the corresponding delay adjustment circuit. Triggering of the secondary amplifier by the delay adjustment circuit is initiated by a secondary amplifier delay signal delayed by an amount chosen by the second fuse circuit. The secondary amplifier may be turned on too early in case data provided on the global data lines is not sufficiently developed at the time the secondary amplifier is enabled. The delay adjustment circuit is located in close proximity to the secondary amplifier, and the block control circuit is located in close proximity to the corresponding block. Thus, a delay on the global data lines from the block to the secondary amplifier is matched to a delay on a line from the block control circuit to the delay adjustment circuit. Due to this matching, a signal development delay is very consistent between the delay adjustment circuit receiving the input and the secondary amplifier receiving data on the global data line. However, even in the integrated circuit disclosed in Patent Document 2, the timing of activation of a sense amplifier is not optimized in a manner that depends on a word line to be selected.

SUMMARY OF THE INVENTION

It is an object of the present invention to provide a semiconductor memory device optimizing the timing of activation of a sense amplifier.

According to the present invention, a semiconductor memory device includes a plurality of word lines, a plurality of bit lines, an address decoder, a sense amplifier, and a sense amplifier control circuit. The plurality of word lines are arranged in rows. The plurality of bit lines are arranged in columns. The address decoder selects one of the word lines in response to an address signal. The sense amplifier amplifies potentials generated on the bit lines. In the sense amplifier control circuit, the more distant the word line selected by the address decoder is from the sense amplifier, the later the sense amplifier is activated.

According to the present invention, the timing of activation of a sense amplifier is optimized in a manner that depends on a word line to be selected. More specifically, the more distant the word line to be selected is from the sense amplifier, the later the sense amplifier is activated. Thus, the difference of the period between when a potential is generated on a bit line and when the sense amplifier amplifies the potential in the following two cases can be reduced to an amount that is substantially negligible: a case where a word line distant from the sense amplifier is driven and a case where a word line close to the sense amplifier is driven. As a result, a soft error is less prone to occur.

BRIEF DESCRIPTION OF THE DRAWINGS

FIG. 16 is a timing diagram showing the operation of the SRAM shown in FIGS. 12 to 15.

FIG. 17 is a functional block diagram showing the components of an SRAM according to a fourth embodiment of the present invention.

FIG. 18 is a timing diagram showing the operation of the SRAM shown in FIG. 17.

DETAILED DESCRIPTION OF PREFERRED EMBODIMENTS

Figure 1:
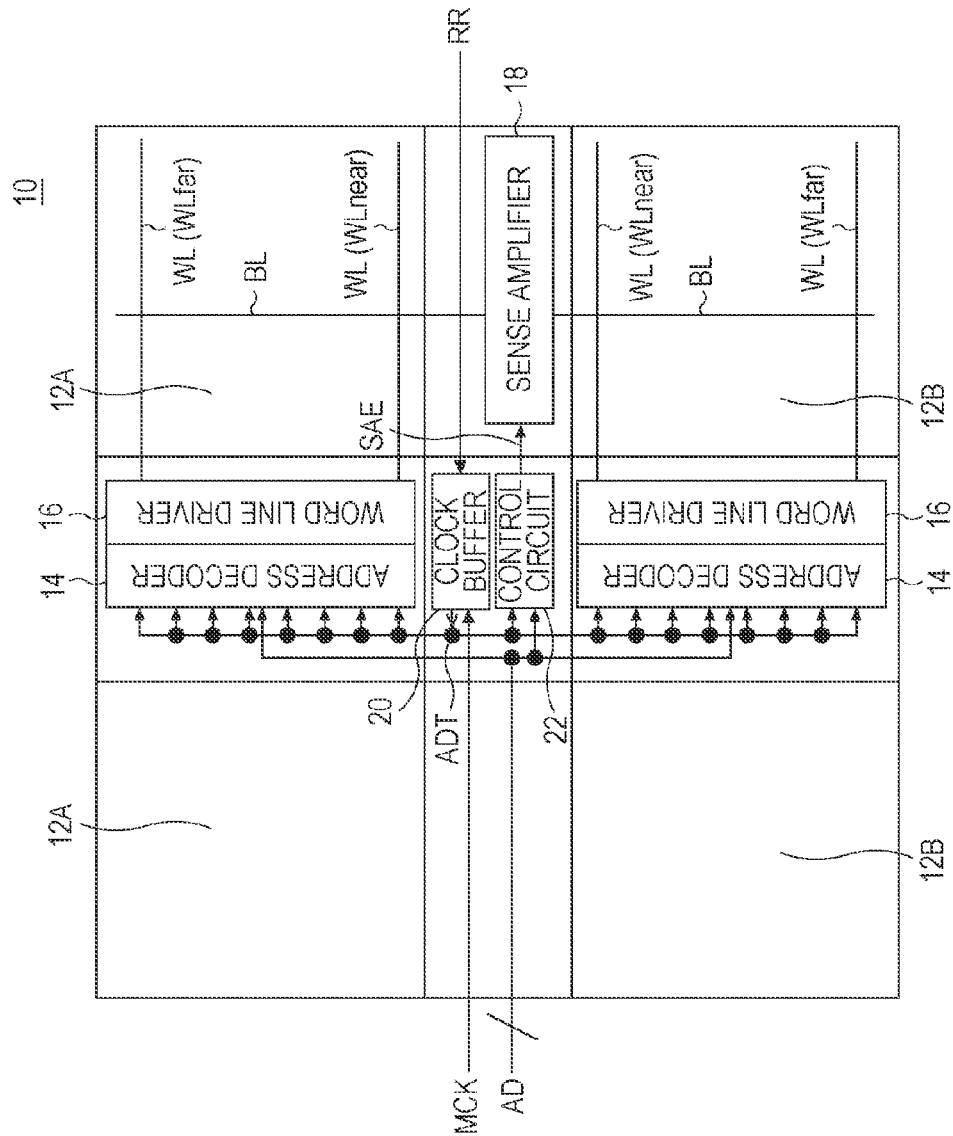
FIG. 1 is a functional block diagram showing the components (structure) of an SRAM according to a first embodiment of the present invention.

Embodiments of the present invention will now be described in detail with reference to the drawings. The same reference numerals are assigned to the same or corresponding components in the drawings, and the description is not repeated.

The following reference numerals have been used to describe embodiments of the present invention:

10, 86, 90, 106: SRAM
14: address decoder
18, SA: sense amplifier
22, 88: sense amplifier control circuit
30: pulse width adjustment circuit
32: delay time adjustment circuit
36 to 44, 62 to 64, 66 to 69, 74 to 76, 80 to 83, 92: inverter
46 to 49, 70, 71, 78: transfer gate
50: AND circuit
WL: word line
BL: bit line
LBL: local bit line
GBL: global bit line
SAE, SAE0 to SAE2: sense amplifier enable signal
td1 to td4: delay time
tw1 to tw4: pulse width Referring to FIG. 1, an SRAM 10 according to an embodiment of the present invention includes a plurality of memory cell arrays 12A and 12B. Each of the memory cell arrays 12A and 12B includes a plurality of memory cells (MC in FIG. 3) aligned (or arranged) in a matrix. The SRAM 10 further includes a plurality of word lines WL aligned in rows and a plurality of bit lines BL aligned in columns. A main clock signal MCK, an address signal AD of multiple bits, and a read request signal RR are provided to the SRAM 10 from the outside.

The SRAM 10 further includes address decoders 14, word line drivers 16, a sense amplifier 18, a clock buffer 20, and a sense amplifier control circuit 22. Each of the address decoders 14 is activated in response to an address decoder trigger signal ADT and selects the word line WL to be driven by decoding the address signal AD. Each of the word line drivers 16 drives the word line WL selected by the address decoder 14. The sense amplifier 18 is activated in response to a sense amplifier enable signal SAE and amplifies a potential generated on the bit line BL. More specifically, the sense amplifier 18 amplifies the potential difference between a potential generated on the bit line BL and a predetermined reference potential (in the embodiment, a potential that is a little lower than a power supply potential). The sense amplifier 18 is shared by the memory cell arrays 12A and 12B on the both sides. The clock buffer 20 operates synchronously with the main clock signal MCK and generates the address decoder trigger signal ADT in response to the read request signal RR. The sense amplifier control circuit 22 is activated in response to the address decoder trigger signal ADT and generates the sense amplifier enable signal SAE in response to the address signal AD. The more distant the word line WL selected by the address decoder 14 is from the sense amplifier 18, the later the sense amplifier control circuit 22 activates the sense amplifier 18. The details are described below.

Figure 2:
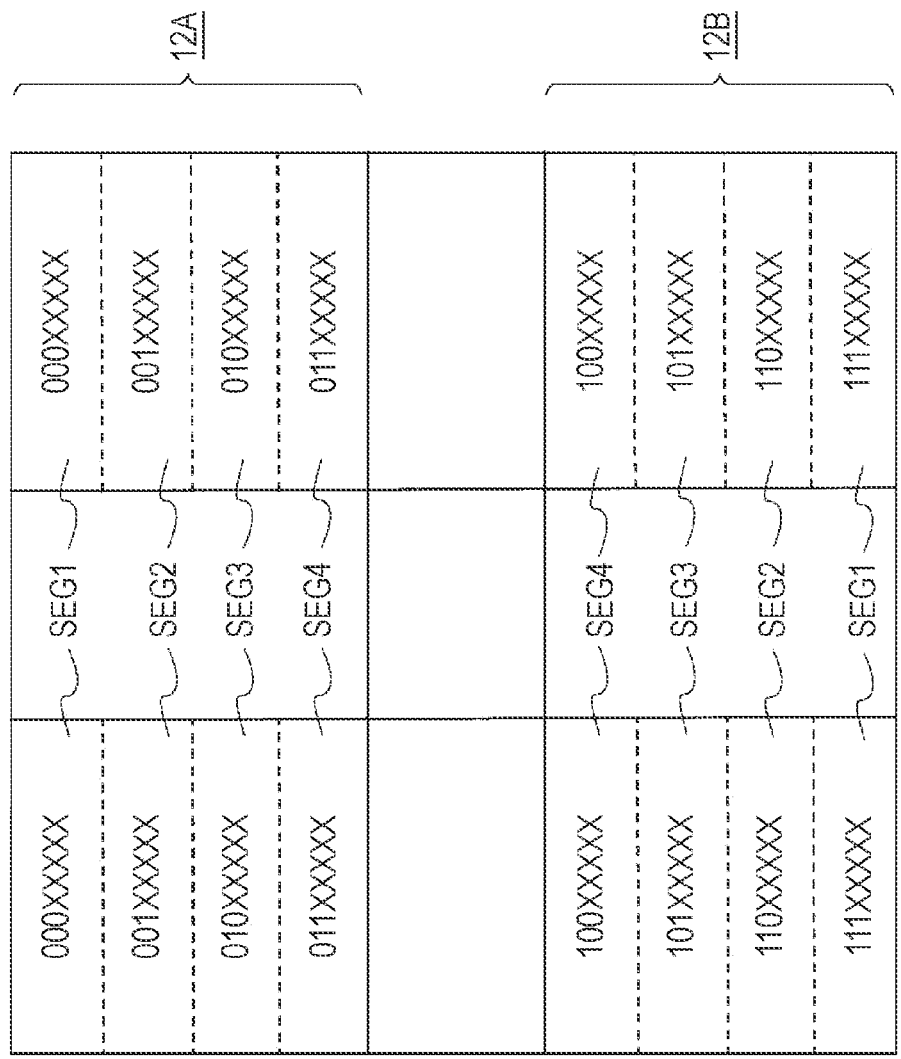
FIG. 2 is an address map of a memory cell array in FIG. 1.

Referring to FIG. 2, each of the memory cell arrays 12A and 12B is partitioned into four segments SEG1 to SEG4. In the memory cell array 12A at the top of the drawing, the three most significant bits of an address assigned to the segment SEG1 are "000". The three most significant bits of an address assigned to the segment SEG2 are "001". The three most significant bits of an address assigned to the segment SEG3 are "010". The three most significant bits of an address assigned to the segment SEG4 are "011". In the memory cell array 12B at the bottom of the drawing, the three most significant bits of an address assigned to the segment SEG1 are "111". The three most significant bits of an address assigned to the segment SEG2 are "110". The three most significant bits of an address assigned to the segment SEG3 are "101". The three most significant bits of an address assigned to the segment SEG4 are "100". An address assigned to each of the segments of the memory cell array 12A at the top and an address assigned to the same segment of the memory cell array 12B at the bottom are complementary to each other. In FIG. 2, "X" is "0" or "1".

In the embodiments of the present invention, "0" and "1" are assigned to a logic low (L) level and a logic high (H) level, respectively. Alternatively, "0" and "1" may be assigned reversely.

Figure 3:
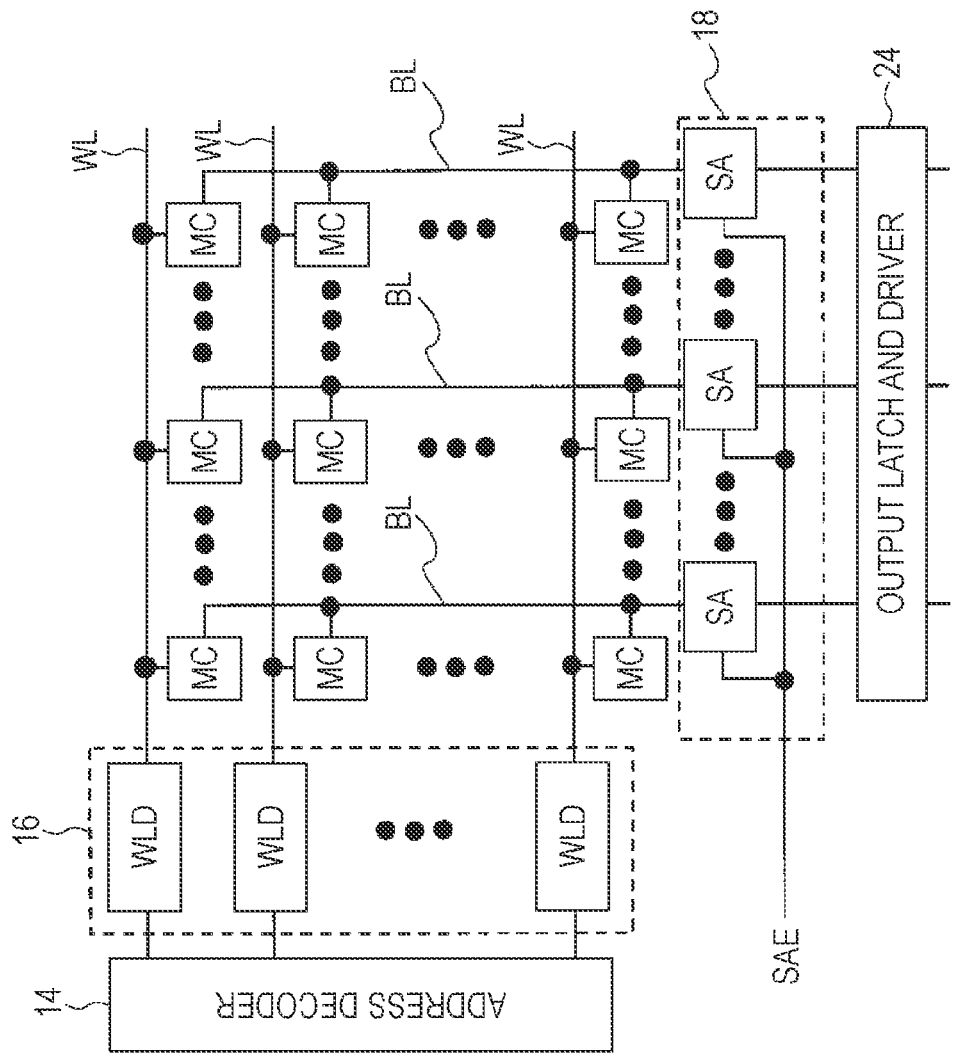
FIG. 3 is a functional block diagram showing the components of the memory cell array and peripheral circuits in FIG. 1.

Referring to FIG. 3, each memory cell MC is connected to the corresponding word line WL and the corresponding bit line BL. A plurality of word line drivers WLD are provided, corresponding to the plurality of word lines WL. Each of the word line drivers WLD drives the corresponding word line WL. The address decoder 14 selects the word line driver WLD to be activated in response to the address signal AD. A plurality of sense amplifiers SA are provided, corresponding to the plurality of bit lines BL. Each of the sense amplifiers SA amplifies a potential generated on the corresponding bit line BL. The sense amplifier enable signal SAE is provided to the plurality of sense amplifiers SA in common The SRAM 10 further includes a plurality of output latches and drivers 24. The output latches and drivers 24 output data signals of multiple bits in parallel, the data signals having been read from the memory cells MC and detected and amplified by the sense amplifier 18.

Figure 4:
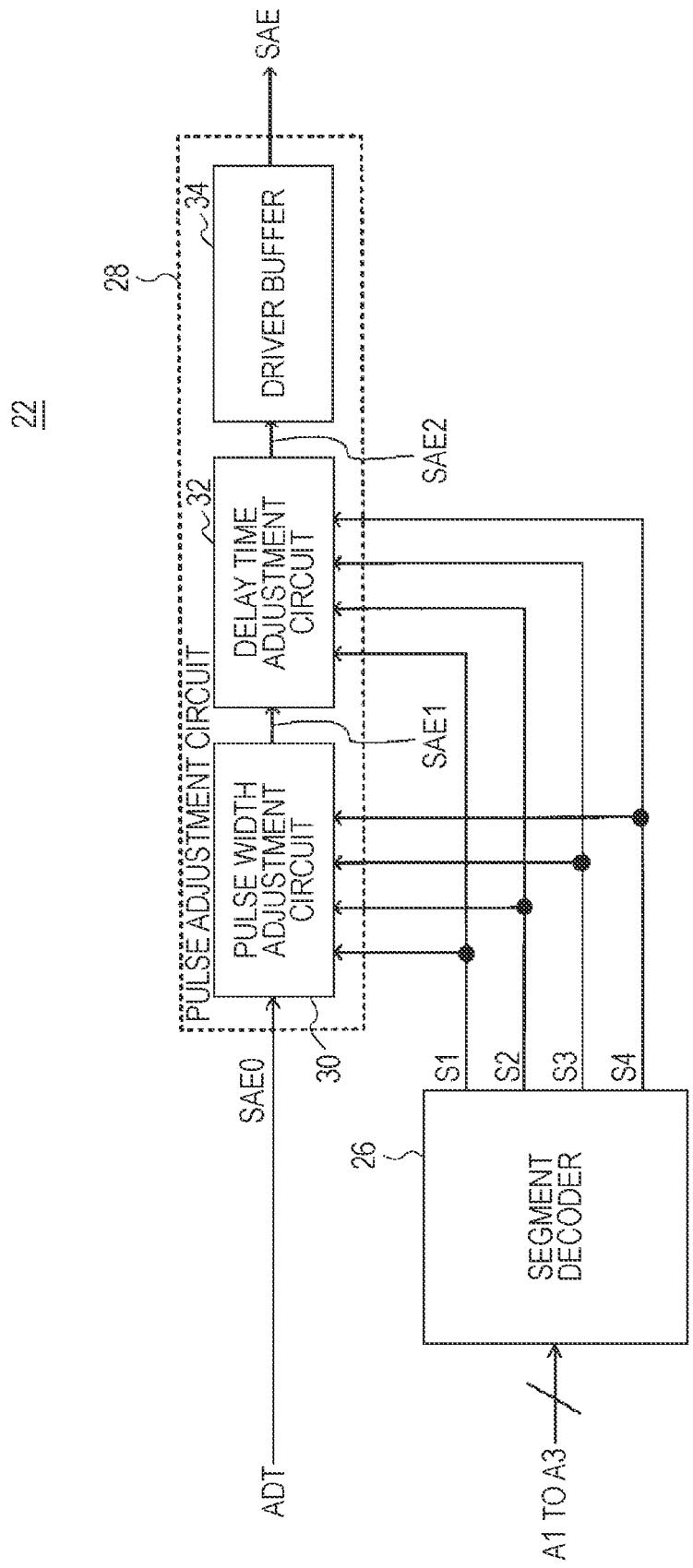
FIG. 4 is a functional block diagram showing the components of a sense amplifier control circuit in FIG. 1.

Referring to FIG. 4, the sense amplifier control circuit 22 includes a segment decoder 26 and a pulse adjustment circuit 28. The segment decoder 26 decodes three most significant bits A1 to A3 of the address signal AD to generate segment signals S1 to S4. Table 1 below is a truth table for the segment decoder 26.

TABLE 1

| INPUT | | | OUTPUT | | | |
|---|---|---|---|---|---|---|
| A1 | A2 | A3 | S1 | S2 | S3 | S4 |
| 0 | 0 | 0 | 1 | 0 | 0 | 0 |
| 0 | 0 | 1 | 0 | 1 | 0 | 0 |
| 0 | 1 | 0 | 0 | 0 | 1 | 0 |
| 0 | 1 | 1 | 0 | 0 | 0 | 1 |
| 1 | 0 | 0 | 0 | 0 | 0 | 1 |
| 1 | 0 | 1 | 0 | 0 | 1 | 0 |
| 1 | 1 | 0 | 0 | 1 | 0 | 0 |
| 1 | 1 | 1 | 1 | 0 | 0 | 0 |

More specifically, when the three most significant bits A1 to A3 are "000" or "111", only the segment signal S1 is at the H level. When the three most significant bits A1 to A3 are "001" or "110", only the segment signal S2 is at the H level. When the three most significant bits A1 to A3 are "010" or "101", only the segment signal S3 is at the H level. When the three most significant bits A1 to A3 are "011" or "100", only the segment signal S4 is at the H level.

The pulse adjustment circuit 28 includes a pulse width adjustment circuit 30, a delay time adjustment circuit 32, and a driver buffer 34. The address decoder trigger signal ADT is provided to the pulse adjustment circuit 28 as a sense amplifier enable signal SAE0. The pulse adjustment circuit 28 generates the sense amplifier enable signal SAE suitable for the segments SEG1 to SEG4 to be accessed by adjusting the pulse width and delay time of the sense amplifier enable signal SAE. The pulse width adjustment circuit 30 generates and outputs a sense amplifier enable signal SAE1 the pulse width of which is adjusted from the sense amplifier enable signal SAE0 (the same as the address decoder trigger signal ADT) in response to the segment signals S1 to S4. The delay time adjustment circuit 32 adjusts the delay time of the sense amplifier enable signal SAE1 in response to the segment signals S1 to S4 to output a sense amplifier enable signal SAE2. Table 2 below shows the relationships among the segment signals S1 to S4, pulse widths tw1 to tw4, and delay times td1 to td4. In Table 2, the following relationships exist: tw1<tw2<tw3<tw4, and td1>td2>td3>td4.

TABLE 2

| | PULSE WIDTH | DELAY TIME |
|---|---|---|
| S1 | tw1 | td1 |
| S2 | tw2 | td2 |
| S3 | tw3 | td3 |
| S4 | tw4 | td4 |

More specifically, when the segment signal S1 is at the H level, the pulse width adjustment circuit 30 sets the pulse width to tw1, and the delay time adjustment circuit 32 sets the delay time to td1. When the segment signal S2 is at the H level, the pulse width adjustment circuit 30 sets the pulse width to tw2, and the delay time adjustment circuit 32 sets the delay time to td2. When the segment signal S3 is at the H level, the pulse width adjustment circuit 30 sets the pulse width to tw3, and the delay time adjustment circuit 32 sets the delay time to td3. When the segment signal S4 is at the H level, the pulse width adjustment circuit 30 sets the pulse width to tw4, and the delay time adjustment circuit 32 sets the delay time to td4.

To be brief, the settings are set so that the more distant the segments SEG1 to SEG4 to be accessed are from the sense amplifier 18, the narrower the pulse width is, and the longer the delay time is. Reversely, the settings are set so that the closer the segments SEG1 to SEG4 to be accessed are to the sense amplifier 18, the wider the pulse width is, and the shorter the delay time is.

Figure 5:
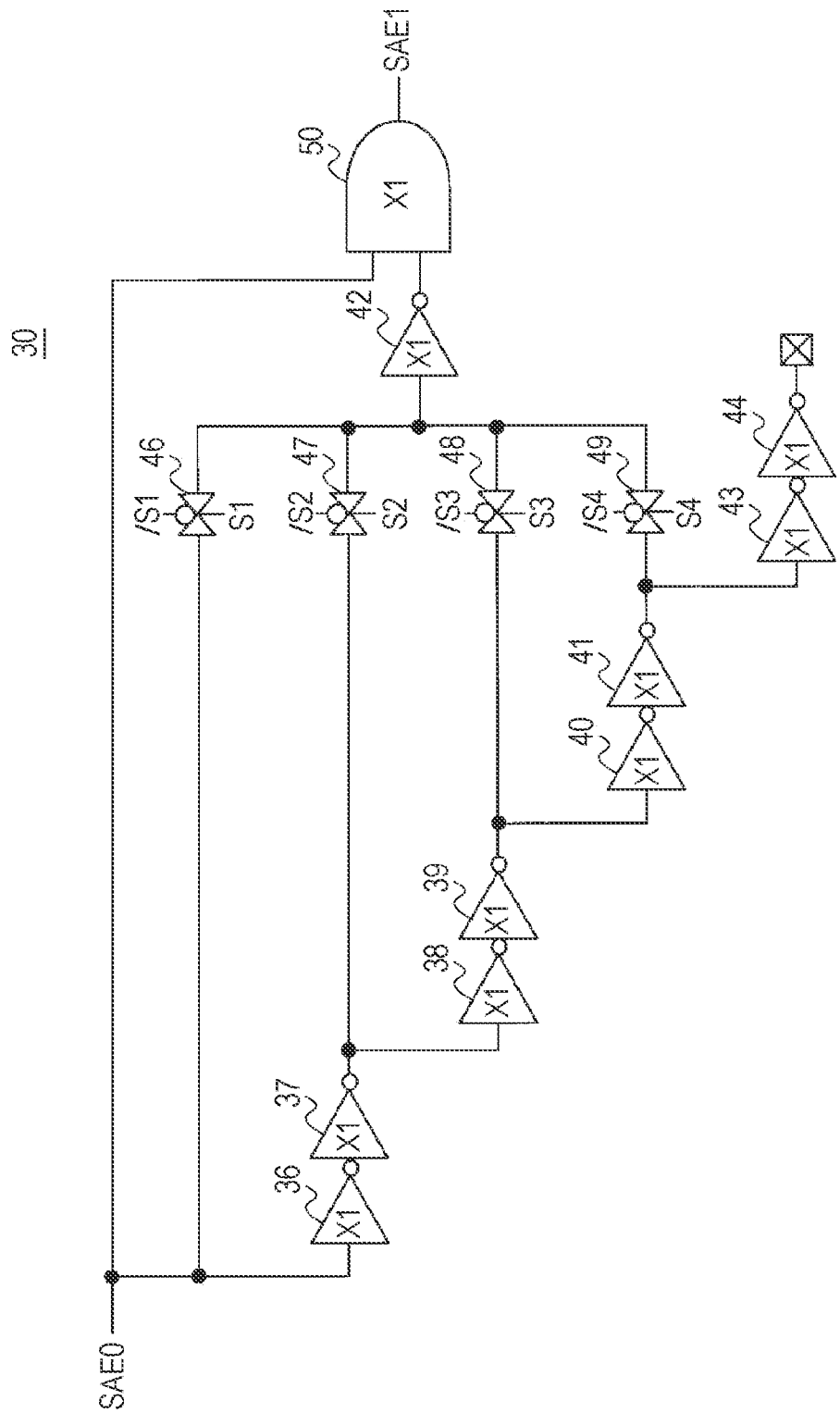
FIG. 5 is a circuit diagram showing the components of a pulse width adjustment circuit in FIG. 4.

Referring to FIG. 5, the pulse width adjustment circuit 30 includes inverters 36 to 44, transfer gates 46 to 49, and an AND circuit 50. The inverters 36 to 44 and the AND circuit 50 all have the same drive capability and thus all can output the same drive current. The inverters 43 and 44 are dummy inverters for optimizing the wiring load and thus can be eliminated. The output of the inverter 44 is open. However, the output of the inverter 44 is preferably grounded via, for example, a MOS capacitor for matching with the input gate capacitance.

When the segment signal S1 is at the H level and when a segment signal /S1 is at the L level, the transfer gate 46 is turned on. Thus, the address decoder trigger signal ADT is provided to the AND circuit 50 via the single inverter 42. As the result, the pulse width is set to tw1. In this case, the single inverter 42 and the AND circuit 50 constitute a one shot pulse generation circuit.

When the segment signal S2 is at the H level and when a segment signal /S2 is at the L level, the transfer gate 47 is turned on. Thus, the address decoder trigger signal ADT is provided to the AND circuit 50 via the three inverters 36, 37, and 42. As the result, the pulse width is set to tw2. In this case, the three inverters 36, 37, and 42 and the AND circuit 50 constitute a one shot pulse generation circuit.

When the segment signal S3 is at the H level and when a segment signal /S3 is at the L level, the transfer gate 48 is turned on. Thus, the address decoder trigger signal ADT is provided to the AND circuit 50 via the five inverters 36 to 39 and 42. As the result, the pulse width is set to tw3. In this case, the five inverters 36 to 39 and 42 and the AND circuit 50 constitute a one shot pulse generation circuit.

When the segment signal S4 is at the H level and when a segment signal /S4 is at the L level, the transfer gate 49 is turned on. Thus, the address decoder trigger signal ADT is provided to the AND circuit 50 via the seven inverters 36 to 42. As the result, the pulse width is set to tw4. In this case, the seven inverters 36 to 42 and the AND circuit 50 constitute a one shot pulse generation circuit.

In this manner, regarding the pulse width, the pulse width adjustment circuit 30 can achieve a relationship: tw1<tw2<tw3<tw4. To be brief, the more distant the word line WL selected by the address decoder 14 is from the sense amplifier 18, the narrower the pulse width adjustment circuit 30 sets the pulse width of the sense amplifier enable signal SAE.

In the embodiment, the transfer gates 46 to 49 change the number of inverters constituting a one shot pulse generation circuit. However, the pulse width adjustment circuit 30 is not limited to the circuit shown in FIG. 5. For example, it can be odd numbers of the inverters connected in series with some of the two series inverters in side shorted with the transfer gates by connecting them in parallel. In this case, when a transfer gate is turned on, two inverters connected in parallel with the transfer gate are disabled.

Figure 6:
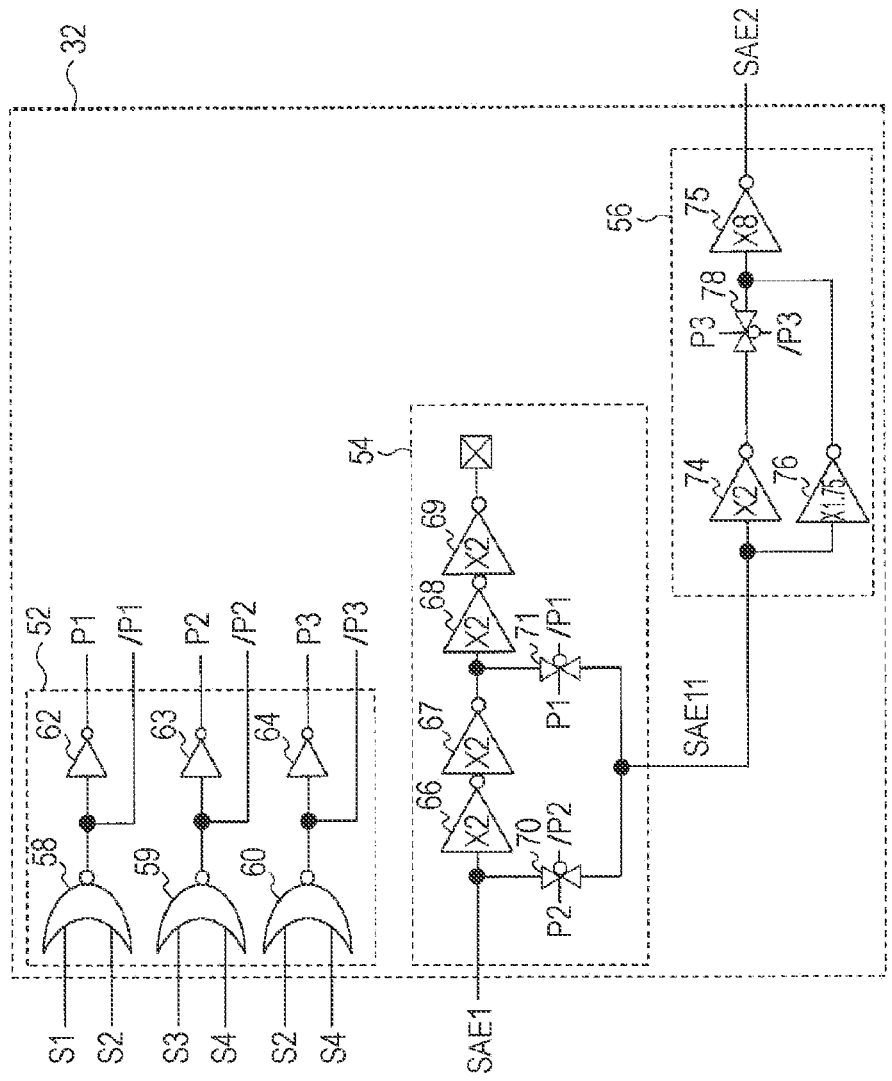
FIG. 6 is a circuit diagram showing the components of a delay time adjustment circuit in FIG. 4.

Referring to FIG. 6, the delay time adjustment circuit 32 includes a decoder 52, a coarse adjustment circuit 54, and a fine adjustment circuit 56. The decoder 52 includes NOR circuits 58 to 60 and inverters 62 to 64. The decoder 52 decodes the segment signals S1 to S4 to signals P1, /P1, P2, /P2, P3, and /P3. Table 3 below is a truth table for the decoder 52.

TABLE 3

| INPUT | | | | OUTPUT | | |
|---|---|---|---|---|---|---|
| S1 | S2 | S3 | S4 | P1 | P2 | P3 |
| 1 | 0 | 0 | 0 | 1 | 0 | 0 |
| 0 | 1 | 0 | 0 | 1 | 0 | 1 |
| 0 | 0 | 1 | 0 | 0 | 1 | 0 |
| 0 | 0 | 0 | 1 | 0 | 1 | 1 |

The coarse adjustment circuit 54 includes inverters 66 to 69 and transfer gates 70 and 71. The coarse adjustment circuit 54 performs coarse adjustment of the delay time of the sense amplifier enable signal SAE1 output from the pulse width adjustment circuit 30. The drive capability of the inverters 66 to 69 is, for example, twice as much as the drive capability of the inverters 36 to 44 shown in FIG. 5. The inverters 68 and 69 are dummy inverters for optimizing the wiring load and thus can be eliminated.

The fine adjustment circuit 56 includes inverters 74 to 76 and a transfer gate 78. The fine adjustment circuit 56 performs fine adjustment of the delay time of a sense amplifier enable signal SAE11 output from the coarse adjustment circuit 54. The drive capability of the inverter 74 is, for example, twice as much as the drive capability of the inverters 36 to 44 shown in FIG. 5. The drive capability of the inverter 75 is, for example, eight times as much as the drive capability of the inverters 36 to 44 shown in FIG. 5. The drive capability of the inverter 76 is, for example, 1.75 times as much as the drive capability of the inverters 36 to 44 shown in FIG. 5.

According to Table 3, when the segment signal S1 is at the H level, the signal P1 is at the H level. As the result, the transfer gate 71 is turned on. Thus, the coarse adjustment circuit 54 delays the sense amplifier enable signal SAE1 output from the pulse width adjustment circuit 30, using the two inverters 66 and 67. Furthermore, the fine adjustment circuit 56 delays the sense amplifier enable signal SAE11 output from the coarse adjustment circuit 54, using the two inverters 76 and 75. As the result, the delay time is set to td1. In this case, only the single inverter 76 drives the input of the inverter 75.

According to Table 3, when the segment signal S2 is at the H level, the signals P1 and P3 are at the H level. As the result, the transfer gates 71 and 78 are turned on. Thus, the coarse adjustment circuit 54 delays the sense amplifier enable signal SAE1 output from the pulse width adjustment circuit 30, using the two inverters 66 and 67. Furthermore, the fine adjustment circuit 56 delays the sense amplifier enable signal SAE11 output from the coarse adjustment circuit 54, using the three inverters 74 to 76. As the result, the delay time is set to td2. In this case, the two inverters 74 and 76 drive the input of the inverter 75. Comparison of this case with the aforementioned case where the segment signal S1 is at the H level shows that the delay time is shortened because the switching speed of the inverter 75 is increased.

According to Table 3, when the segment signal S3 is at the H level, the signal P2 is at the H level. As the result, the transfer gate 70 is turned on. Thus, the coarse adjustment circuit 54 outputs the sense amplifier enable signal SAE1 output from the pulse width adjustment circuit 30 without delay. Furthermore, the fine adjustment circuit 56 delays the sense amplifier enable signal SAE11 output from the coarse adjustment circuit 54, using the two inverters 76 and 75. As the result, the delay time is set to td3. In this case, only the single inverter 76 drives the input of the inverter 75.

According to Table 3, when the segment signal S4 is at the H level, the signals P2 and P3 are at the H level. As the result, the transfer gates 70 and 78 are turned on. Thus, the coarse adjustment circuit 54 outputs the sense amplifier enable signal SAE1 output from the pulse width adjustment circuit 30 without delay. Furthermore, the fine adjustment circuit 56 delays the sense amplifier enable signal SAE11 output from the coarse adjustment circuit 54, using the three inverters 74 to 76. As the result, the delay time is set to td4. In this case, the two inverters 74 and 76 drive the input of the inverter 75. Comparison of this case with the aforementioned case where the segment signal S3 is at the H level shows that the delay time is shortened because the switching speed of the inverter 75 is increased.

In this manner, regarding the delay time, the delay time adjustment circuit 32 can achieve a relationship: td1>td2>td3>td4. To be brief, the more distant the word line WL selected by the address decoder 14 is from the sense amplifier 18, the longer the delay time adjustment circuit 32 sets the delay time of the sense amplifier enable signal SAE. Thus, the sense amplifier control circuit 22 can dynamically change the delay time for each access, using the information of an address to be accessed (an address to be used to select the corresponding word line WL).

In the embodiment, the inverters 66 to 69 and 74 to 76 are delay elements delaying a sense amplifier enable signal. The transfer gates 70 and 71 change the number of inverters (delay elements) delaying a sense amplifier enable signal. However, for example, when the minimum unit of delay time need not be so small, the delay time adjustment circuit 32 is not limited to the circuit shown in FIG. 6. For example, a plurality of inverters may be connected in series, and a single transfer gate may be connected in parallel with every two of the inverters. In this case, when a transfer gate is turned on, two inverters connected in parallel with the transfer gate are disabled. Moreover, instead of an inverter, for example, an RC time constant circuit including a resistor and a capacitor may be used as a delay element.

Figure 7:
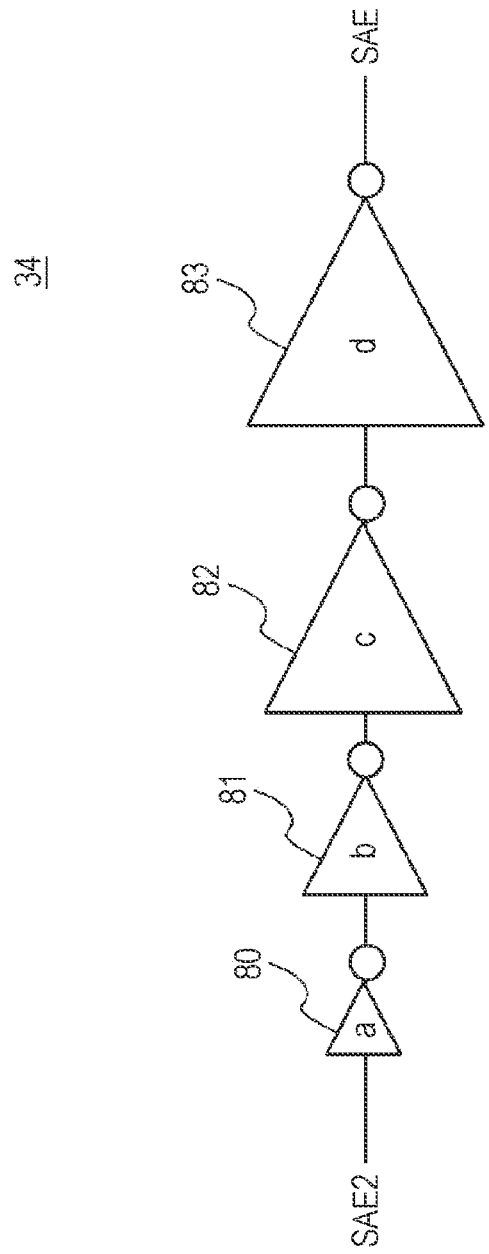
FIG. 7 is a circuit diagram showing the components of a driver buffer in FIG. 4.

Referring to FIG. 7, the driver buffer 34 includes inverters 80 to 83. Assuming that the respective drive capabilities of the inverters 80 to 83 are a, b, c, and d, a relationship: a<b<c<d exists. In the embodiment, the respective drive capabilities of the inverters 80 to 83 differ from each other so as to optimize the wiring load. However, the drive capabilities may be the same.

The operation of the aforementioned SRAM will next be described with reference to a timing diagram shown in FIG. 8.

After the read request signal RR is activated to the H level, when the main clock signal MCK rises to the H level, the potential of the corresponding word line WL rises. This is because the address decoder 14 is activated in response to the address decoder trigger signal ADT generated by the clock buffer 20 shown in FIG. 1.

After the word line WL is driven, when a bit line pre-charge signal /PC is deactivated to the H level, pre-charging to the corresponding bit line BL is completed and thus the potential of the bit line BL slightly drops in response to data in the corresponding memory cell MC.

After pre-charging to the bit line BL is completed, the sense amplifier enable signal SAE is activated to the H level. This is because the sense amplifier control circuit 22 is activated in response to the address decoder trigger signal ADT.

When the sense amplifier enable signal SAE is activated, the sense amplifier 18 is activated. Thus, when the potential of the bit line BL is lower than a predetermined reference potential, the potential of the bit line BL drops to ground potential GND. On the other hand, when the potential of the bit line BL is higher than the predetermined reference potential, the potential of the bit line BL rises to power supply potential VCC. In the embodiment, the bit line BL is pre-charged to power supply potential VCC. However, the pre-charge potential of the bit line BL is not limited to power supply potential VCC and may be, for example, potential VCC/2 that is half of the power supply potential or ground potential GND other than power supply potential VCC when the predetermined reference potential and the like are adjusted.

The timing of activation of the sense amplifier enable signal SAE varies with the segments SEG1 to SEG4 to be accessed. More specifically, when the segment SEG4 closest to the sense amplifier 18 is accessed, the sense amplifier enable signal SAE is activated earliest. When the segment SEG3 second closest to the sense amplifier 18 is accessed, the sense amplifier enable signal SAE is activated second earliest (third latest). When the segment SEG2 third closest to the sense amplifier 18 is accessed, the sense amplifier enable signal SAE is activated third earliest (second latest). When the segment SEG1 most distant from the sense amplifier 18 is accessed, the sense amplifier enable signal SAE is activated latest. To be brief, the more distant the word line WL driven by the address decoder 14 is from the sense amplifier 18, the later the sense amplifier enable signal SAE is activated.

Referring again to FIG. 1, when a word line WLfar far from the sense amplifier 18 is driven, the effective distance of the corresponding bit line BL from the word line WLfar to the sense amplifier 18 is long, and thus time necessary to transfer a potential generated on the bit line BL to the sense amplifier 18 is long. On the other hand, when a word line WLnear near the sense amplifier 18 is driven, the effective distance of the bit line BL from the word line WLnear to the sense amplifier 18 is short, and thus time necessary to transfer a potential generated on the bit line BL to the sense amplifier 18 is short. However, the more distant the word line WL driven by the address decoder 14 is from the sense amplifier 18, the later the sense amplifier enable signal SAE is activated. Thus, there is little difference between the following cases in the time between generation of a potential and amplification of the potential by the sense amplifier 18: a case where the word line WLfar far from the sense amplifier 18 is driven and a case where the word line WLnear near the sense amplifier 18 is driven. As a result, a soft error is less prone to occur.

Although to an extent lesser than in accommodating a difference in the signal transfer time of the bit line BL, the embodiment is also effective in accommodating a difference in the transfer time of the address decoder trigger signal ADT. The address decoder trigger signal ADT output from the clock buffer 20 is distributed to a plurality of inputs of the address decoder 14. This is because these inputs are distributed in a large range in the direction of the bit lines BL. Since the address decoder trigger signal ADT input physically close to the corresponding word line WL is used to activate the word line WL, a difference arises in the time the word line WL is activated in a manner that depends on the value of an address AD. Specifically, this is because the timing of activation of the word line WL by decoding the address AD by the use of the address decoder 14 is early on a side near the clock buffer 20 (or the sense amplifier 18) and late on a side far from the clock buffer 20 (or the sense amplifier 18).

The more distant the word line WL driven by the address decoder 14 is from the sense amplifier 18, the later the sense amplifier enable signal SAE is activated. Thus, the cycle of the sense amplifier enable signal SAE may be longer than the cycle of the main clock signal MCK. However, the more distant the word line WL selected by the address decoder 14 is from the sense amplifier 18, the narrower the pulse width adjustment circuit 30 sets the pulse width of the sense amplifier enable signal SAE, as shown in FIGS. 4 and 5. Thus, it seldom occurs.

When there is no possibility that the cycle of the sense amplifier enable signal SAE is longer than the cycle of the main clock signal MCK, the pulse width adjustment circuit 30 may not be provided. That is, the pulse width adjustment circuit 30 is optional.

In this embodiment, the sense amplifier control circuit 22 does not always activate the sense amplifier 18 at the same timing but dynamically controls the timing of activation of the sense amplifier 18 in response to the address signal AD(A1 to A3), as shown in FIG. 4. That is, the timing of activation of the sense amplifier 18 is always changed, using the address signal AD.

In this embodiment, each of the memory cell arrays 12A and 12B is partitioned into the four segments SEG1 to SEG4. However, the number of partitions is not limited to a specific number. For example, the number of partitions may be set the same as the number of the word lines WL. In this case, the timing of activation of the sense amplifier enable signal SAE varies in compliance with the word lines WL to be driven.

According to the embodiment, since the timing and duration of activation of the sense amplifier SA are controlled in a manner that depends on the distance between the memory cell MC to be accessed and the corresponding sense amplifier SA, using an address to be accessed, a delay in a detected data signal and a deterioration in the waveform when the data signal passes through an entire path extending from the memory cell MC to the sense amplifier SA can be reduced. Thus, the soft error rate (SER) can be improved.

That is, according to the embodiment, the timing of activation of the sense amplifier SA can be controlled by dynamically adjusting the delay time and pulse width of the sense amplifier enable signal SAE after receiving the read request signal RR and the main clock signal MCK. Thus, fast access can be achieved. The embodiment is preferably applicable to an SRAM in which the access time of a memory cell array is less than a nanosecond (ns), for example, 0.1 nanoseconds.

In another embodiment, the sense amplifier control circuit 22 is not limited to that shown in FIG. 4. The sense amplifier control circuit 22 shown in FIG. 4 generates the sense amplifier enable signal SAE on the basis of the address decoder trigger signal ADT. On the other hand, in an SRAM 86 according to a second embodiment of the present invention shown in FIG. 9, a sense amplifier control circuit 88 internally generates a signal corresponding to the address decoder trigger signal ADT on the basis of the main clock signal MCK and the read request signal RR and then generates the sense amplifier enable signal SAE on the basis of the generated signal.

More specifically, the main clock signal MCK is provided to not only the clock buffer 20 but also the sense amplifier control circuit 88. Similarly, the read request signal RR is provided to not only the clock buffer 20 but also the sense amplifier control circuit 88.

Figure 10:
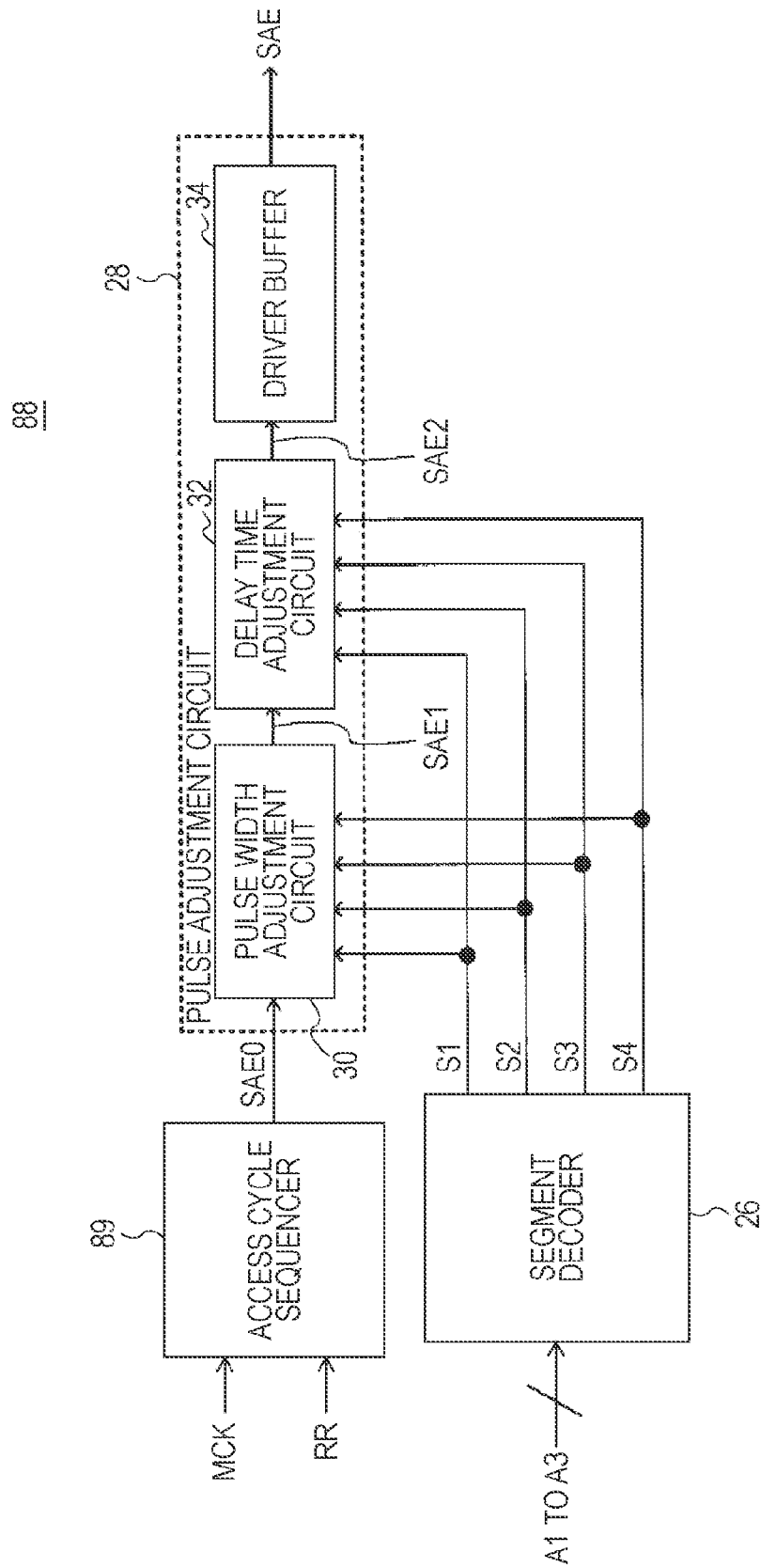
FIG. 10 is a functional block diagram showing the components of a sense amplifier control circuit in FIG. 9.

Referring to FIG. 10, the sense amplifier control circuit 88 includes an access cycle sequencer 89 in addition to the components shown in FIG. 4. The access cycle sequencer 89 generates the sense amplifier enable signal SAE0 in synchronization with the main clock signal MCK.

Figure 8:
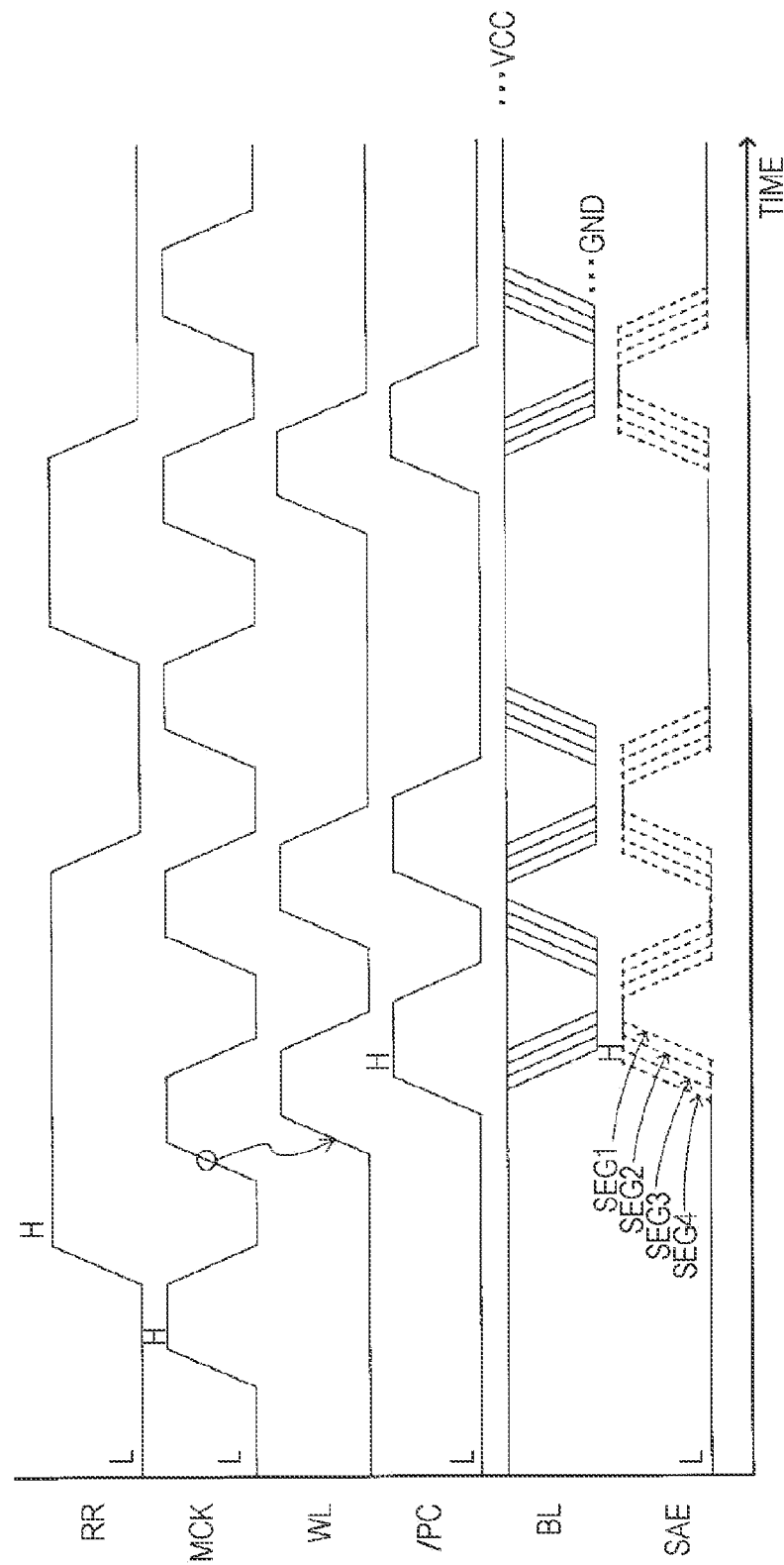
FIG. 8 is a timing diagram showing the operation of the SRAM shown in FIGS. 1 to 7.

In the first embodiment shown in FIG. 8, within one cycle of the main clock signal MCK, the word line WL is driven, and the sense amplifier enable signal SAE is activated. On the other hand, in the second embodiment shown in FIG. 11, within one cycle of the main clock signal MCK, the word line WL is driven. Then, within one cycle of the next main clock signal MCK, the sense amplifier enable signal SAE is activated. Thus, the present invention is also applicable to a high-speed pipelined SRAM.

Figure 12:
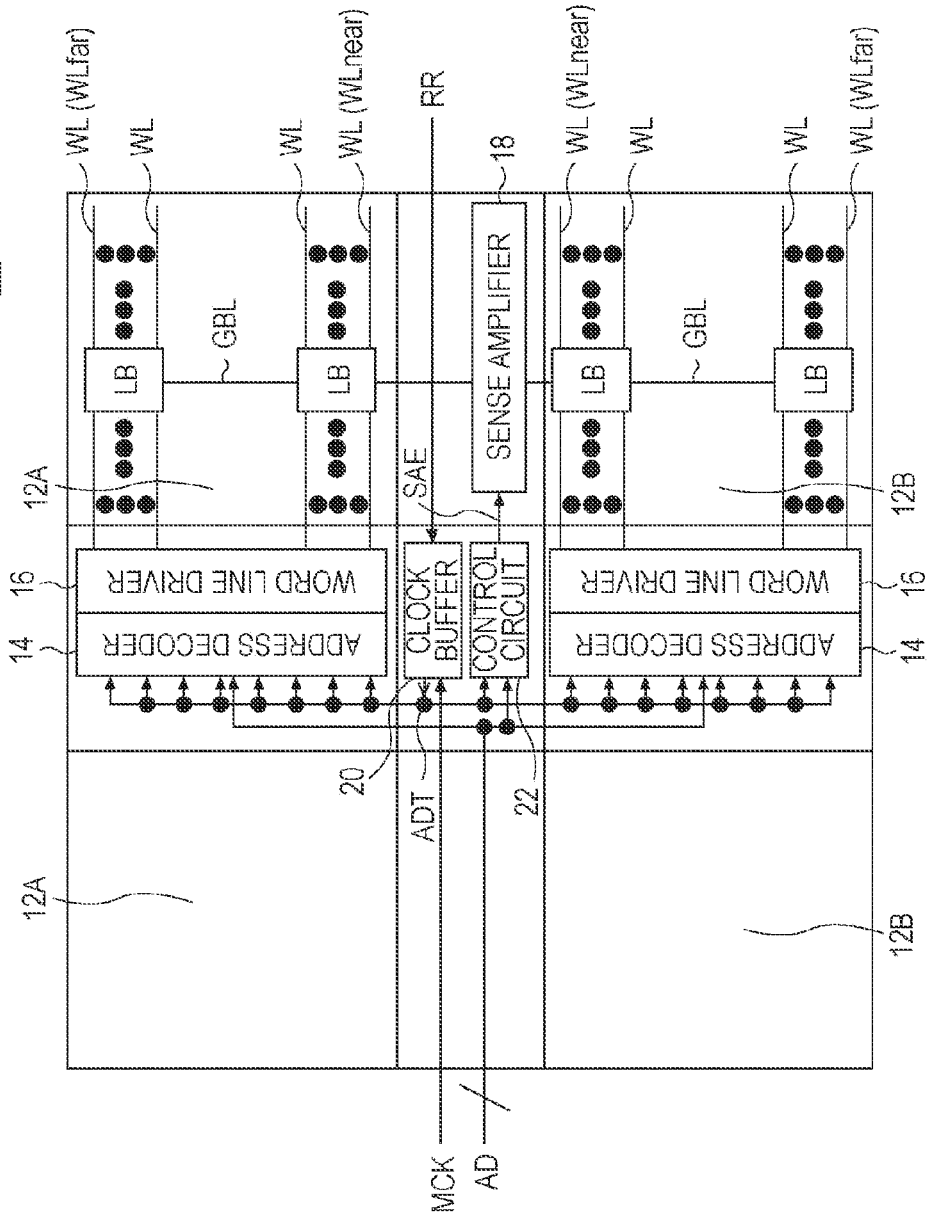
FIG. 12 is a functional block diagram showing the components of an SRAM according to a third embodiment of the present invention.
Figure 13:
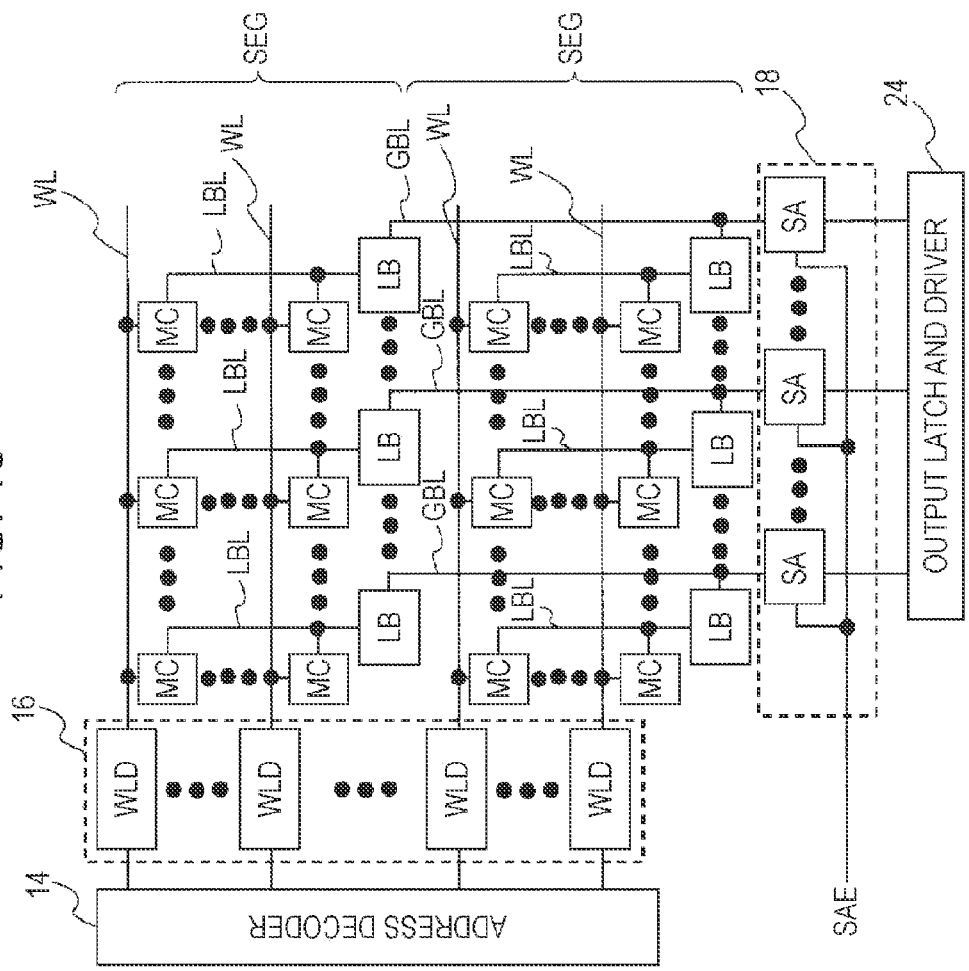
FIG. 13 is a functional block diagram showing the components of a memory cell array and peripheral circuits in FIG. 12.

In still another embodiment, the present invention is also applicable to an SRAM 90 with hierarchical (partitioned) bit line structure shown in FIGS. 12 and 13. Referring to FIGS. 12 and 13, the SRAM 90 according to a third embodiment of the present invention includes a plurality of global bit lines GBL, a plurality of local bit lines LBL, and a plurality of local buffers LB. Each of the local buffers LB is provided for the corresponding local bit line LBL. FIG. 13 shows the structure or components of a memory cell array and peripheral circuits shown in FIG. 12. Each of the local buffers LB is connected to the corresponding local bit line LBL. Each of the global bit lines GBL is provided, corresponding to the plurality of local bit lines LBL arranged in a single column. The global bit line GBL is connected to the plurality of corresponding local buffers LB in common The local buffer LB transfers a data signal on the corresponding local bit line LBL to the corresponding global bit line GBL. Each of the sense amplifiers SA is provided for the corresponding global bit line GBL. The sense amplifier SA amplifies a potential generated on the global bit line GBL. For example, the aforementioned segments SEG are assigned, corresponding to the plurality of local bit lines LBL aligned in the row direction.

The local buffer LB is not limited to a specific one. The inverter-based local buffer LB shown in FIG. 14 or the NAND-based local buffer LB shown in FIG. 15 may be adopted.

Figure 14:
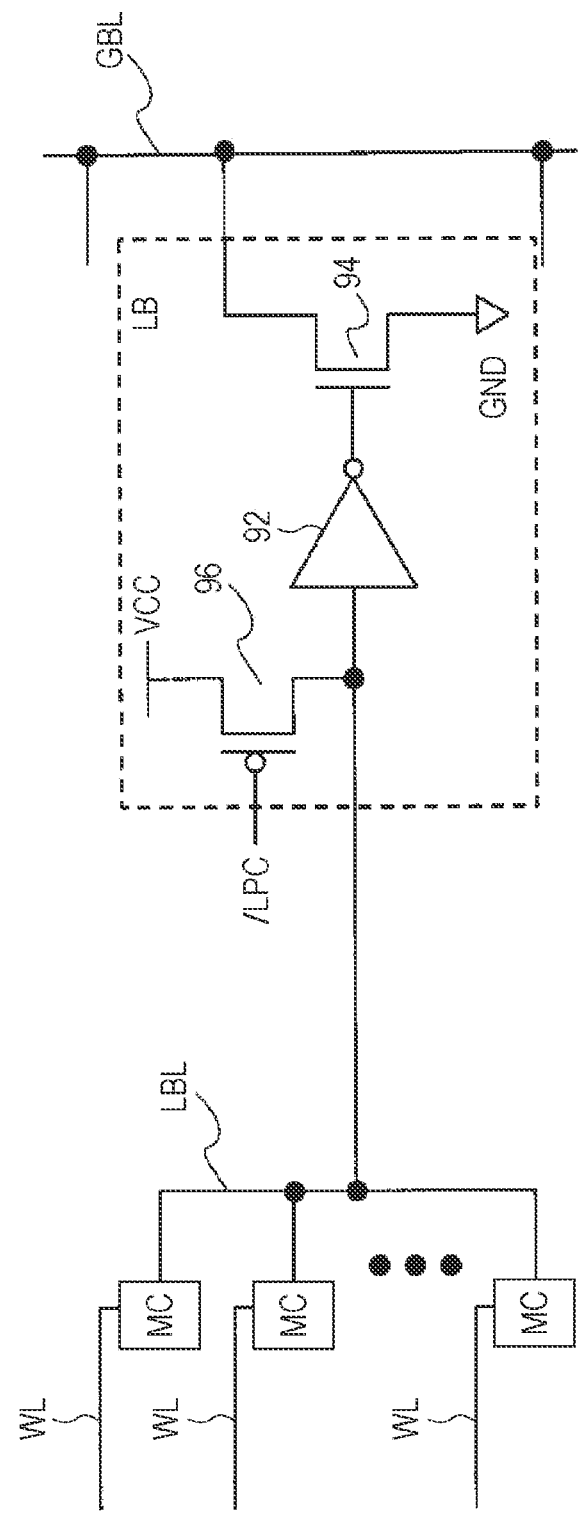
FIG. 14 is a circuit diagram showing an example of a local buffer in FIG. 12.

The inverter-based local buffer LB shown in FIG. 14 includes an inverter 92, an n-channel field-effect transistor 94, and a p-channel field-effect transistor 96. When the potential of the corresponding local bit line LBL is close to ground potential GND, the transistor 94 is turned on, and thus the potential of the corresponding global bit line GBL is also close to ground potential GND. When a local bit line pre-charge signal /LPC is activated to the L level, the transistor 96 is turned on, and thus the local bit line LBL is pre-charged to power supply potential VCC.

Figure 15:
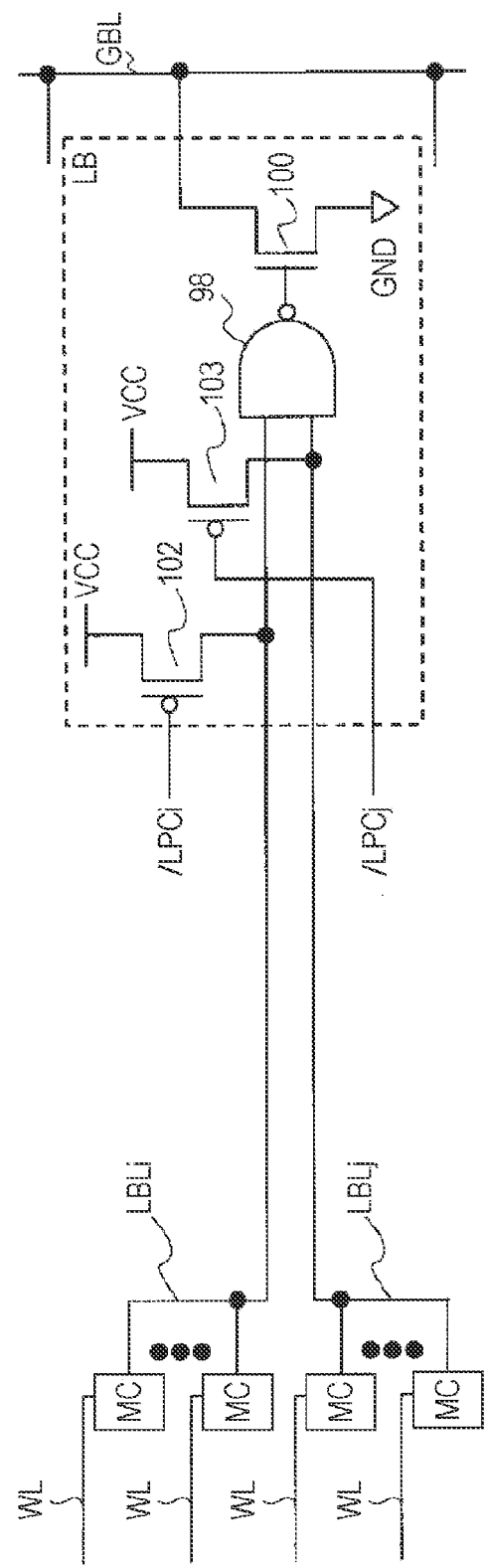
FIG. 15 is a circuit diagram showing another example of a local buffer in FIG. 12.

The NAND-based local buffer LB shown in FIG. 15 includes an NAND circuit 98, an n-channel field-effect transistor 100, and a plurality of p-channel field-effect transistors 102 and 103. The NAND circuit 98 includes a plurality of inputs corresponding to local bit lines LBLi and LBLj. The plurality of p-channel field-effect transistors 102 and 103 are provided, corresponding to the plurality of local bit lines LBLi and LBLj. When the potential of the local bit line LBLi is close to ground potential GND, the transistor 100 is turned on, and thus the potential of the corresponding global bit line GBL is also close to ground potential GND. Even when the potential of the local bit line LBLj is close to ground potential GND, the transistor 100 is turned on, and thus the potential of the global bit line GBL is also close to ground potential GND. When a local bit line pre-charge signal /LPCi is activated to the L level, the transistor 102 is turned on, and thus the local bit line LBLi is pre-charged to power supply potential VCC.

When a local bit line pre-charge signal /LPCj is activated to the L level, the transistor 103 is turned on, and thus the local bit line LBLj is pre-charged to power supply potential VCC.

According to a timing diagram shown in FIG. 16, the operation in the third embodiment is intrinsically the same as the operation in the first embodiment shown in FIG. 8. That is, within one cycle of the main clock signal MCK, the word line WL is driven, and the sense amplifier enable signal SAE is activated. However, in the third embodiment shown in FIG. 16, the local bit line LBL is pre-charged in response to the local bit line pre-charge signal /LPC. The global bit line GBL is pre-charged in response to a global bit line pre-charge signal /GPC.

Figure 9:
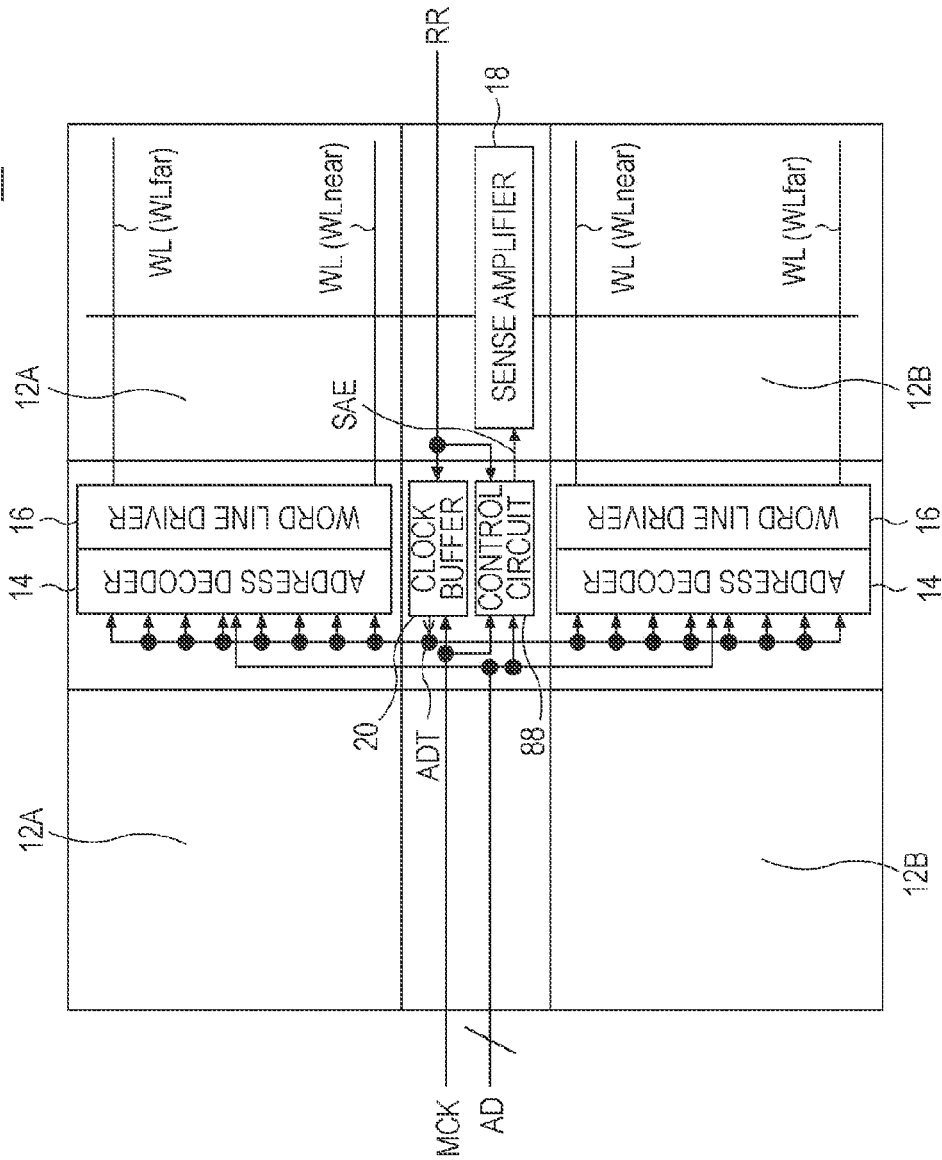
FIG. 9 is a functional block diagram showing the components of an SRAM according to a second embodiment of the present invention.

A fourth embodiment shown in FIG. 17 is a combination of the second embodiment shown in FIG. 9 and the third embodiment shown in FIG. 12. More specifically, an SRAM 106 according to the fourth embodiment includes the same sense amplifier control circuit 88 as in the second embodiment and has the same hierarchical bit line structure as in the third embodiment.

Figure 11:
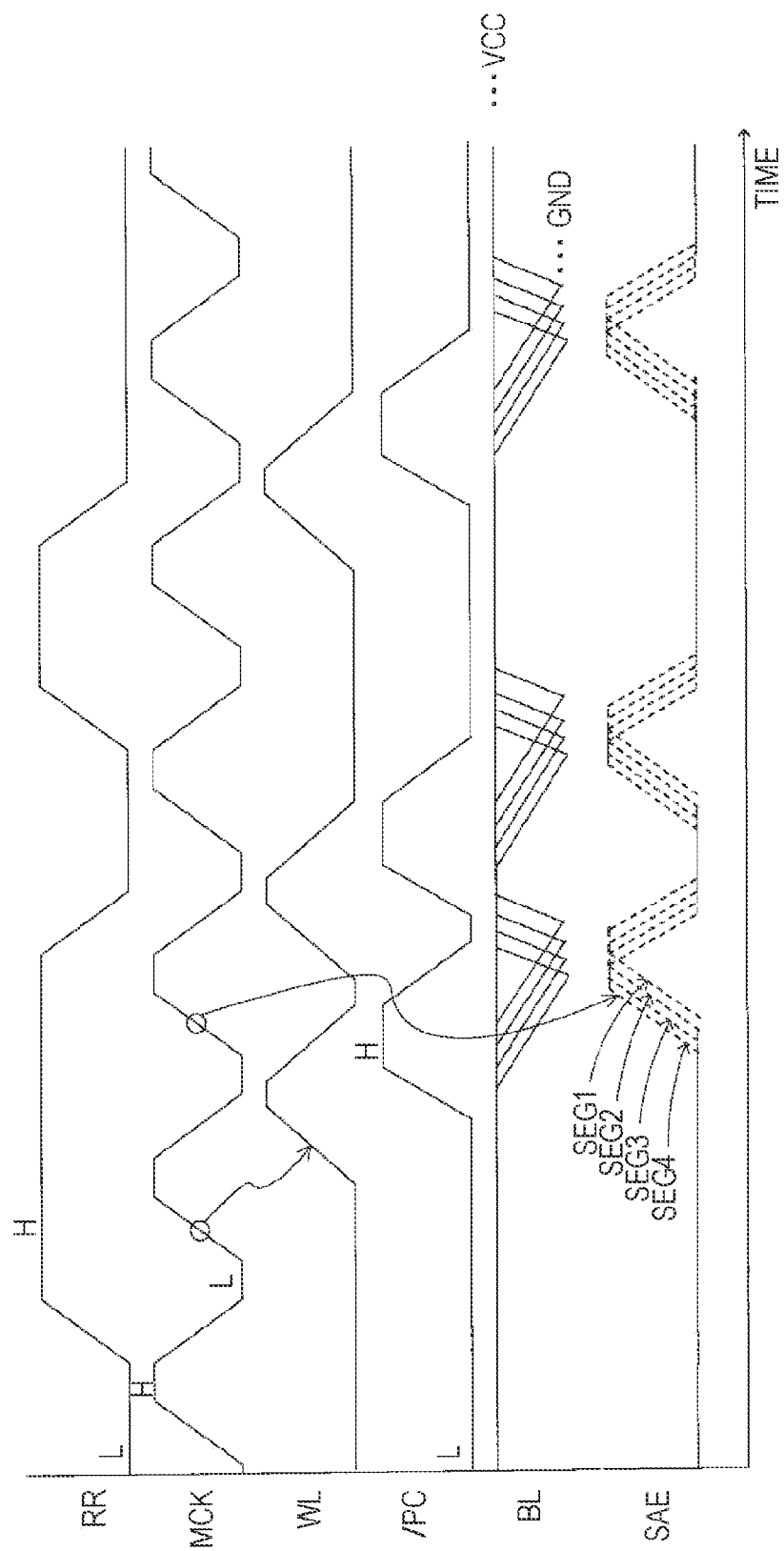
FIG. 11 is a timing diagram showing the operation of the SRAM shown in FIGS. 9 and 10.

According to a timing diagram shown in FIG. 18, the operation in the fourth embodiment is substantially the same as the operation in the second embodiment shown in FIG. 11. That is, within one cycle of the main clock signal MCK, the word line WL is driven, and then, within one cycle of the next main clock signal MCK, the sense amplifier enable signal SAE is activated. However, in the fourth embodiment shown in FIG. 18, the local bit line LBL is pre-charged in response to the local bit line pre-charge signal /LPC. The global bit line GBL is pre-charged in response to the global bit line pre-charge signal /GPC.

In the aforementioned embodiments, the single bit line BL is provided. However, in the present invention, instead of the single bit line BL, a differential bit line pair including two bit lines may be used. Similarly, in the present invention, instead of the global bit line GBL, a global bit line pair may be used, and instead of the local bit line LBL, a local bit line pair may be used. In this case, the sense amplifier amplifies the potential difference between a pair of bit lines or a pair of global bit lines.

In the aforementioned embodiments, a plurality of pieces of data amplified by the sense amplifier 18 are simultaneously output, using the output latches and drivers 24. However, in the present invention, a column decoder may be provided. The column decoder selects, in response to a column address signal, one or two or more pieces of data from a plurality of pieces of data amplified by the sense amplifier 18 and outputs the selected pieces of data. In this case, the address decoder 14 in the aforementioned embodiments functions as a row decoder.

The present invention is applicable to not only the SRAMs such as the aforementioned embodiments but also all types of semiconductor memory devices such as a register file and a DRAM.

The embodiments of the present invention have been described. The aforementioned embodiments are just illustrative examples to implement the present invention. Thus, the present invention is not limited to the aforementioned embodiments and may be implemented by appropriately modifying the aforementioned embodiments within the spirit of the present invention.

What is claimed is:

1. A semiconductor memory device comprising:
   a plurality of word lines arranged in rows;
   a plurality of bit lines arranged in columns;
   an address decoder that selects one of the word lines in response to an address signal;

a sense amplifier that amplifies potentials generated on the bit lines; and a sense amplifier control circuit in which the more distant the word line selected by the address decoder is from the sense amplifier, the later the sense amplifier is activated, and wherein the sense amplifier is activated in response to a sense amplifier enable signal, and the sense amplifier control circuit includes a delay time adjustment circuit in which the more distant the word line selected by the address decoder is from the sense amplifier, the longer a delay time of the sense amplifier enable signal is set, wherein the sense amplifier control circuit further includes a pulse width adjustment circuit, wherein the pulse width adjustment circuit includes a one shot pulse generation circuit, the one shot pulse generation circuit includes:

an odd number of inverters; and an AND circuit that accepts an input signal of the one shot pulse generation circuit and an output signal of the last inverter out of the odd number of inverters, and the pulse width adjustment circuit includes means for changing the number of the inverters.

2. The semiconductor memory device according to claim 1, wherein the sense amplifier control circuit dynamically controls a timing of activation of the sense amplifier in response to the address signal.

3. The semiconductor memory device according to claim 1, wherein the delay time adjustment circuit includes: one or more delay elements that delay the sense amplifier enable signal; and means for changing the number of the delay elements.

* * * * *